United States Patent
Wang et al.

(10) Patent No.: US 12,408,505 B2
(45) Date of Patent: Sep. 2, 2025

(54) FLUORESCENT QUANTUM DOTS AS WELL AS PREPARATION METHOD AND USE THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Qiangbin Wang, Suzhou (CN); Hongchao Yang, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 715 days.

(21) Appl. No.: 17/785,420

(22) PCT Filed: Dec. 21, 2021

(86) PCT No.: PCT/CN2021/140056
§ 371 (c)(1),
(2) Date: Jun. 15, 2022

(87) PCT Pub. No.: WO2022/156467
PCT Pub. Date: Jul. 28, 2022

(65) Prior Publication Data
US 2023/0247846 A1    Aug. 3, 2023

(30) Foreign Application Priority Data

Jan. 20, 2021 (CN) ......................... 202110073230.0
Oct. 25, 2021 (CN) ......................... 202111243959.4

(51) Int. Cl.
*H10K 50/115* (2023.01)
*B82Y 30/00* (2011.01)
(Continued)

(52) U.S. Cl.
CPC ............ *H10K 50/115* (2023.02); *B82Y 30/00* (2013.01); *B82Y 40/00* (2013.01); *C09K 11/58* (2013.01); *C09K 11/88* (2013.01)

(58) Field of Classification Search
CPC ...... H10K 50/115; B82Y 40/00; B82Y 30/00; C09K 11/58; C09K 11/88
(Continued)

(56) References Cited

U.S. PATENT DOCUMENTS

2011/0012087 A1    1/2011    Allen et al.

FOREIGN PATENT DOCUMENTS

| CN | 103396802 A | 11/2013 |
|---|---|---|
| CN | 103881723 A | 6/2014 |

(Continued)

OTHER PUBLICATIONS

CN 112877062 A English translation (Year: 2021).*
(Continued)

*Primary Examiner* — Anita Nassiri-Motlagh
(74) *Attorney, Agent, or Firm* — Bayramoglu Law Offices LLC

(57) ABSTRACT

The preparation method for fluorescent quantum dots includes: carrying out solvothermal reaction on a first evenly mixed reaction system containing a silver source, a negative ion source and a weakly polar solvent to prepare a silver-based quantum dots precursor; and carrying out ion exchange reaction on a second evenly mixed reaction system containing the silver-based quantum dots precursor, a negative ion source and/or a metal positive ion source to obtain alloyed fluorescent quantum dots with a fluorescence emission peak wavelength of 500-1700 nm and an absolute quantum efficiency of more than 85%. The silver-based quantum dots are prepared through a simple high-temperature solvothermal method and then the alloyed quantum dots (Continued)

are obtained by the ion exchange method, and therefore the synthesis process is simple and controllable. The obtained fluorescent quantum dots can be prepared on large scale, and have adjustable fluorescence emission from visible to near-infrared region and excellent photostability.

5 Claims, 5 Drawing Sheets

(51) Int. Cl.
*B82Y 40/00* (2011.01)
*C09K 11/58* (2006.01)
*C09K 11/88* (2006.01)

(58) Field of Classification Search
USPC .................................................. 252/301.4 R
See application file for complete search history.

(56) References Cited

FOREIGN PATENT DOCUMENTS

| CN | 104007095 | A | | 8/2014 |
|---|---|---|---|---|
| CN | 104513664 | A | | 4/2015 |
| CN | 105733570 | A | * | 7/2016 |
| CN | 106520123 | A | | 3/2017 |
| CN | 109423273 | A | | 3/2019 |
| CN | 112877062 | A | | 6/2021 |
| JP | 2018044142 | A | | 3/2018 |

OTHER PUBLICATIONS

CN 105733570 A English translation (Year: 2016).*
CN-103396802-A English translation (Year: 2013).*
Chunyan Li, et al., Advanced Fluorescence Imaging Technology in the Near-Infrared-II Window for Biomedical Applications, Journal of the American Chemical Society, 2020, pp. 14789-14804, vol. 142.
Mariona Dalmases, et al., Synthesis and Thermoelectric Properties of Noble Metal Ternary Chalcogenide Systems of Ag—Au—Se in the Forms of Alloyed Nanoparticles and Colloidal Nanoheterostructures, Chemistry of Materials, 2016, pp. 7017-7028, vol. 28.
Minghui Liu, et al., General Synthetic Approach to Heterostructured Nanocrystals Based on Noble Metals and I-VI, II-VI, and I-III-VI Metal Chalcogenides, Langmuir, 2014, pp. 9838-9849, vol. 30.
Hongchao Yang, et al., Colloidal Alloyed Quantum Dots with Enhanced Photoluminescence Quantum Yield in the NIR-II Window, Journal of the American Chemical Society, 2021, pp. 2601-2607, vol. 143.
Toshihiro Kuzuya, et al., Synthesis of Ag/ AgCuS/CuInS2 hybrid nanoparticles by reductive cation exchange and their asymmetric heterostructure, Applied Surface Science, 2019, pp. 1278-1285, vol. 493.

* cited by examiner

FLUORESCENT QUANTUM DOTS AS WELL AS PREPARATION METHOD AND USE THEREOF

CROSS REFERENCE TO RELATED APPLICATION

This patent application is the national phase entry of International Application No. PCT/CN2021/140056, filed on Dec. 21, 2021, which is based upon and claims the benefit and priority of Chinese Patent Application No. 202110073230.0 filed on Jan. 20, 2021 entitled with "NEAR-INFRARED SILVER GOLD SELENIDE FLUORESCENT QUANTUM DOTS AS WELL AS PREPARATION METHOD AND USE THEREOF" and the benefit and priority of Chinese Patent Application No. 202111243959.4 filed on Oct. 25, 2021 entitled with "ALLOYED FLUORESCENT QUANTUM DOTS AS WELL AS PREPARATION METHOD AND USE THEREOF", the disclosures of which are incorporated by reference herein in its entirety as parts of the present application.

TECHNICAL FIELD

The present disclosure relates to a type of fluorescent quantum dots and a preparation method thereof, particularly to alloyed fluorescent quantum dots and a preparation method thereof, and high-quantum efficiency near-infrared silver gold selenide fluorescent quantum dots as well as a preparation method and use thereof, belonging to the field of material science and technology.

BACKGROUND

Fluorescence imaging technology has the advantages of noncontact, real-time images, high sensitivity, convenient economy, and no radiological hazards, which has a wide disclosure prospect in biomedical researches and clinical practices, especially in the aspect of fluorescent image surgical navigation. According to the wavelength range of fluorescence imaging, the fluorescence imaging mainly includes visible light fluorescence imaging (400-650 nm) and near-infrared fluorescence imaging (650-1700 nm). In biological imaging, near-infrared light can be divided into two optical windows: the first near-infrared region (650-900 nm, NIR-I) and the second near-infrared II region (900-1700 nm, NI-II). NIR-fluorescence is a new fluorescence window in an in vivo fluorescence imaging research in the past ten years. The attenuation coefficient of NIR-II photons in living tissues is significantly reduced compared with those in visible light region and NIR-I region (*J. Am. Chem. Soc.* 2020, 142, 14789-14804.), and therefore NIR-II fluorescence has a higher tissue penetration depth and space resolution in in vivo imaging.

As an excellent fluorescent light-emitting material, quantum dots have the characteristics of high biocompatibility, high quantum efficiency, adjustable excitation and emission wavelengths, easy surface functionalization and the like, and have extremely wide applications in researches on in-vivo imaging, light-emitting diodes, photoelectric detectors, lasers, photovoltaic cells and the like. However, the existing fluorescent quantum dots, such as lead sulfide, cadmium telluride, lead selenide, mercury telluride and silver selenide, have relatively low absolute fluorescent quantum yield, or a part of fluorescent quantum dots contain toxic heavy metal elements, leading to a fact that fluorescent intensity and toxicity cannot be simultaneously considered. Therefore, it is urgent to develop novel fluorescent quantum dots with continuously adjustable single emission, high fluorescence quantum efficiency and high biocompatibility in a visible-near infrared full window (500-1700 nm).

SUMMARY

The main objective of the present disclosure is to provide high-quantum efficiency fluorescent quantum dots as well as a preparation method and use thereof, overcoming the shortcomings in the properties of the existing quantum dots.

In order to realize the foregoing objective, the present disclosure adopts the following technical solution:

Embodiments of the present disclosure provide a preparation method of alloyed fluorescent quantum dots, comprising:

carrying out solvothermal reaction on a first evenly mixed reaction system containing a silver source, a negative ion source and a weakly polar solvent to prepare a silver-based quantum dots precursor; and carrying out ion exchange reaction on a second evenly mixed reaction system containing the silver-based quantum dots precursor, the negative ion source and/or a metal positive ion source at 0-260° C. for 0.4-72 h to obtain the alloyed fluorescent quantum dots.

In some embodiments, the negative ion source comprises a combination of any one or more than two of a sulfur source, a selenium source and a tellurium source.

In some embodiments, metal elements contained in the metal positive ion source comprise a combination of any one or more than two of Mn, Fe, Co, Ni, Cu, Zn, Au, Pd, Pt and In.

Embodiments of the present disclosure also provide the alloyed fluorescent quantum dots prepared by the above method, wherein the fluorescence emission peak of the alloyed fluorescent quantum dots has a wavelength of 500-1700 nm.

Further, the alloyed fluorescent quantum dots have an absolute quantum efficiency of more than 85%.

Further, the alloyed fluorescent quantum dots comprise a combination of any one or more than two of AgAuSe, AgAuS, AgAuTe, CuAgS, CuAgSe and AgInTe$_2$.

Further, the alloyed fluorescent quantum dots comprise doped alloyed fluorescent quantum dots.

Further, the alloyed fluorescent quantum dots have a core-shell structure.

Embodiments of the present disclosure also provide a preparation method of a near-infrared silver gold selenide fluorescent quantum dots, comprising:

carrying out solvothermal reaction on a third evenly mixed reaction system containing a silver source, a selenium source and a weakly polar solvent to prepare a silver selenide quantum dots precursor; and carrying out ion exchange reaction on a fourth evenly mixed reaction system containing the silver selenide quantum dot precursor and a gold source for 10-72 h at 0-200° C. to obtain the near-infrared silver gold selenide fluorescent quantum dots.

Embodiments of the present disclosure also provide the near-infrared silver gold selenide fluorescent quantum dots prepared by the above method, wherein the near-infrared silver gold selenide fluorescent quantum dots have a diameter of 2-20 nm with uniform size distribution, a fluorescence emission peak wavelength of 800-1700 nm and an absolute quantum yield of more than 90%.

Embodiments of the present disclosure also provide use of the above any alloyed fluorescent quantum dots or near-infrared silver gold selenide fluorescent quantum dots in the fields of biological imaging, biomedicines or near-infrared devices (such as a near-infrared light-emitting diode, a solar cell, a photoelectric detector or a laser) and the like.

Compared with the prior art, the present disclosure has the beneficial effects:

1) In the present disclosure, silver-based quantum dots (including silver selenide quantum dots) are prepared by a simple high-temperature solvothermal method, and then alloyed quantum dots are obtained by an ion exchange method, so the synthesis process is simple in steps, controllable in experimental conditions, simple and easily available in used reagents, relatively high in final product, and suitable for large-scale production.
2) The final product alloyed fluorescent quantum dots prepared in the present disclosure have uniform size distribution, and tunable fluorescence emission from visible lights to near-infrared lights, and excellent photostability, and meanwhile the final product alloyed fluorescent quantum dots do not contain any toxic heavy metal elements and have a wide disclosure prospect in the fields of biological imaging, near-infrared devices and the like.
3) The preparation process of the present disclosure can also be extended to the preparation processes of other fluorescent quantum dots which are high yield and easy to amplify a reaction scale.

BRIEF DESCRIPTION OF THE DRAWINGS

For more clearly illustrating the technical solution of the present disclosure, embodiments or drawings used in the description of the prior art will be simply introduced below. Obviously, the drawings described below are only some embodiments of the present disclosure, and persons of ordinary skill in the art can also obtain other drawings according to these drawings without creative efforts.

DETAILED DESCRIPTION OF THE EMBODIMENTS

Figure 1:
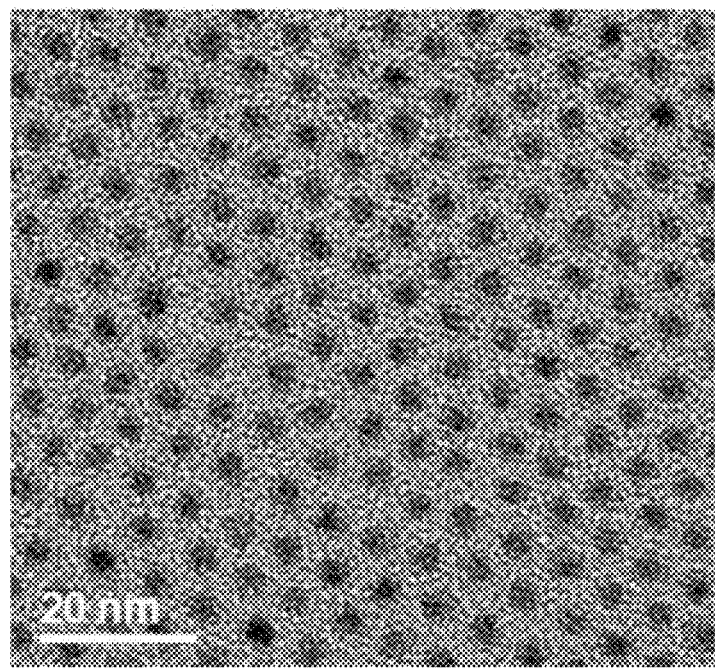
FIG. 1 is a transmission electron microscopy image of alloyed fluorescent quantum dots prepared in example 1 of the present disclosure.

As previously mentioned, since the existing fluorescent quantum dots such as lead sulfide, cadmium telluride, lead selenide, mercury telluride and silver selenide have relatively low absolute fluorescent quantum yield, and meanwhile a part of the existing fluorescent quantum dots contain toxic heavy metal elements, so fluorescent intensity and toxicity cannot be simultaneously considered. Through long-term research and lots of practices, the inventors of this case found that alloyed quantum dots in which some elements are subjected to ion exchange with silver-based quantum dots have good optical property. Next, the technical solution of the present disclosure will be explained and illustrated in detail.

As one aspect of the technical solution of the present disclosure, provided is a preparation method of alloyed fluorescent quantum dots, comprising:

carrying out solvothermal reaction on a first evenly mixed reaction system containing a silver source, a negative ion source and a weakly polar solvent to prepare silver-based quantum dot precursor; and carrying out ion exchange reaction on a second evenly mixed reaction system containing the silver-based quantum dots precursor, the negative ion source and/or a metal positive ion source at 0-260° C. for 0.4-72 h to obtain alloyed fluorescent quantum dots.

In some embodiments, the silver source comprises a silver salt which comprises a combination of any one or more than two of silver chloride, silver bromide, silver iodide, silver sulfate, silver nitrate, silver carbonate, silver acetate, silver sulfide, silver trifluoroacetate and silver diethyldithiocarbamate, but is not limited thereto.

In some embodiments, the negative ion source comprises a combination of any one or more than two of a sulfur source, a selenium source and a tellurium source, but is not limited thereto.

Further, the sulfur source comprises a combination of any one or more than two of sulfur, sodium thiosulfate, sodium sulfide and thiourea, but is not limited thereto.

Further, the selenium source comprises a combination of any one or more than two of selenium dioxide, selenium, sodium selenate, sodium selenite, sodium selenide and diphenyl diselenide, but is not limited thereto.

Further, the tellurium source comprises a combination of any one or more than two of tellurium, sodium tellurite and sodium tellurium hydride, but is not limited thereto.

Further, the weakly polar solvent comprises a combination of any one or more than two of oleylamine, oleic acid, octadecene, octadecylamine, dodecylamine, tetradecylamine, dodecanethiol, octanethiol and octadecanethiol, but is not limited thereto.

In some embodiments, a mass ratio of the silver source to the negative ion source is 1-10: 1-10.

In some embodiments, the solvothermal reaction lasts for 0.5-2.4 h at 100-300° C.

In some preferred embodiments, the silver-based quantum dot precursor comprises a combination of any one or more than two of $Ag_2S$, $Ag_2Se$ and $Ag_2Te$, but is not limited thereto.

Further, in some more typical embodiments, the preparation method also comprises: dissolving silver nitrate into oleylamine, adding a sulfur source, reacting for 6 h at 200° C., and then washing to obtain a target product silver-based quantum dots precursor.

In some preferred embodiments, the preparation method can comprise: dissolving 0.1-1 g of silver salt into a weakly polar solvent.

Further, the preparation method specifically comprises: mixing the silver sulfide precursor with a gold source and reacting at 100° C. to obtain silver gold sulfur fluorescent quantum dots.

Further, the preparation method also comprises: washing the obtained silver gold sulfur fluorescent quantum dots after the reaction is ended.

In some embodiments, a mass ratio of the silver-based quantum dot precursor to the metal positive ion source is 1-10:1-10.

In some preferred embodiments, metal elements contained in the metal positive ion source comprise a combination of any one or more than two of Mn, Fe, Co, Ni, Cu, Zn, Au, Pd, Pt and In, but is not limited thereto.

Further, the metal positive ion source comprises a combination of any one or more than two of ferric chloride, ferrous chloride, ferric sulfate, ferrous sulfate, ferric nitrate, cobalt chloride, cobalt nitrate, cobalt sulfate, cobalt acetate, nickel chloride, nickel nitrate, nickel sulfate, nickel acetate, copper sulfate, copper acetate, copper nitrate, copper chloride, cuprous chloride, zinc acetate, zinc nitrate, zinc sulfate, zinc chloride, sodium chloroaurate, chloroauric acid, gold nitrate, gold chloride, gold hydroxide, gold oxide, palladium acetate, palladium nitrate, palladium chloride, chloroplatinic acid, sodium chloroplatinate, potassium chloroplatinate, indium acetate and indium chloride, but is not limited thereto.

Where, the silver salt, the negative ion source, the weakly polar solvent and the metal positive ion source and the like described above can be selected from types listed as above, but are not limited thereto.

In some embodiments, the preparation method specifically comprises:

evenly mixing a silver source with a weakly polar solvent and adding a negative ion source, and carrying out solvothermal reaction to prepare the silver-based quantum dots precursor (also called "silver-based quantum dots precursor");

mixing and reacting the silver-based quantum dot precursor with a metal positive ion source at 0-260° C. to obtain alloyed fluorescent quantum dots whose fluorescence emission peak wavelength is 500-1700 nm.

Where, the metal positive ion uses a gold source and the negative ion source uses a sulfur source, as one of more specific embodiments, the preparation method of the alloyed fluorescent quantum dots can comprise the following steps:

I. performing ultrasonic homodisperse after a silver salt is mixed with a weakly polar solvent;

II. adding a sulfur source into the mixed solution finally obtained in step I, mixing, performing homodisperse, and then reacting for 0.5-24 h at 100-300° C.;

III. separating the product obtained by solvothermal reaction in step II, washing and drying; and IV. reacting the product obtained in step III with a gold source for 10-72 h at 0-200° C. to obtain near-infrared silver gold sulfur fluorescent quantum dots.

The final product alloyed fluorescent quantum dots prepared in the present disclosure have uniform size distribution, a fluorescence emission peak wavelength of 500-1700 nm, preferably 800-1350 nm, and an ultrahigh absolute quantum efficiency (85%), and meanwhile does not contain any toxic heavy metal elements. Furthermore, the yield of the final product is relatively high, and the preparation process is easy to amplify the reaction scale.

As another aspect of the technical solution of the present disclosure, also provided are the alloyed fluorescent quantum dots prepared by the above method, which have a homogeneous morphology size and a high absolute quantum yield, does not contain any toxic heavy metal elements, and has an important disclosure prospect in the fields of biological imaging, biological medicines or near-infrared devices.

Further, the alloyed fluorescent quantum dots can preferably comprise a combination of any one or more than two of AgAuSe, AgAuS, AgAuTe, CuAgS, CuAgSe and AgInTe$_2$, but is not limited thereto.

Further, the alloyed fluorescent quantum dots comprise doped alloyed fluorescent quantum dots; preferably, for example, a combination of any one or more than two of manganese-doped silver selenide fluorescent quantum dots, nickel-doped silver telluride fluorescent quantum dots, indium-doped silver sulfide fluorescent quantum dots and cobalt-doped silver sulfide fluorescent quantum dots, but are not limited thereto.

Further, the alloyed fluorescent quantum dots have a core-shell structure; for example, the alloyed fluorescent quantum dots preferably comprise a combination of any one or more than two of Ag$_2$S@ZnS, Ag$_2$Te@Ag$_2$S, Ag$_2$Te@Ag$_2$Se, Ag$_2$Se@Ag$_2$S, Ag$_2$Se@Ag$_2$Te, Ag$_2$S@Ag$_2$Se, Ag$_2$S@Ag$_2$Te, Ag$_2$Se@ZnS, Ag$_2$Se@ZnSe and Ag$_2$S@MnS, but are not limited thereto.

Another aspect of the embodiments of the present disclosure also provides a preparation method of near-infrared silver gold selenide fluorescent quantum dots, comprising:

carrying out solvothermal reaction on a third evenly mixed reaction system containing a silver source, a selenium source and a weakly polar solvent to prepare silver selenide quantum dots precursor; and carrying out ion exchange reaction on a fourth evenly mixed reaction system containing the silver selenide quantum dots precursor and a gold source for 10-72 h at 0-200° C. to obtain the near-infrared silver gold selenide fluorescent quantum dots.

In some embodiments, the preparation method mainly comprises: dissolving the silver source into the weakly polar solvent to be evenly mixed and carrying out solvothermal reaction to prepare silver selenide quantum dots; and mixing the above silver selenide quantum dots with gold source, and carrying out positive ion exchange reaction at room temperature to obtain high-quantum efficiency near-infrared silver gold selenium quantum dots which have a fluorescence emission wavelength of 800-1700 nm.

In some preferred embodiments, the preparation method of the high-quantum efficiency near-infrared silver gold selenium quantum dots can specifically comprise:

evenly mixing a silver source with a weakly polar solvent, adding a selenium source, and carrying out solvothermal reaction to prepare silver selenide quantum dots precursor;

mixing and reacting the silver selenide quantum dots precursor with a gold source at 0-200° C. to obtain silver gold selenide fluorescent quantum dots which have a fluorescence emission wavelength of 800-1700 nm and an absolute fluorescent quantum yield of more than 90%.

In some embodiments, the preparation method comprises: evenly mixing a silver source with a weakly polar solvent, and adding a selenium source, so as to form the third evenly mixed reaction system.

In some embodiments, the preparation method specifically comprises: carrying out solvothermal reaction on the third evenly mixed reaction system for 0.5-24 h at 100-300° C. to prepare the silver selenide quantum dots precursor.

In some embodiments, a mass ratio of the silver source to the selenium source is 1-10:1-10. That is to say, the preparation method comprises: dissolving the silver source and the selenium source which are in a mass ratio of 1-10:1-10 into the weakly polar solvent.

The preparation process of the silver selenide precursor provided by the present disclosure is the solvothermal reaction, which is simple in steps, controllable in experiment conditions, simple and available in used reagents, high in final product yield, and suitable for large-scale production.

In some embodiments, the preparation method comprises: evenly mixing the silver selenide quantum dots precursor and the gold source with the weakly polar solvent to form the fourth evenly mixed reaction system.

In some embodiments, a mass ratio of the silver selenide quantum dots to the gold source is 1-10:1-10. That is to say, the preparation method comprises: dissolving the silver selenide quantum dots precursor and the gold source which are in a mass ratio of 1-10:1-10 into the weakly polar solvent.

In some embodiments, the silver salt comprises a combination of any one or more two of silver chloride, silver bromide, silver iodide, silver sulfate, silver nitrate, silver carbonate, silver sulfide, silver trifluoroacetate and silver diethyldithiocarbamate, but is not limited thereto.

In some embodiments, the selenium source comprises a combination of any one or more than two of selenium dioxide, selenium powder, sodium selenate, sodium selenite, sodium selenide and diphenyl diselenide, but is not limited thereto.

In some embodiments, the weakly polar solvent comprises a combination of any one or more than two of oleylamine, oleic acid, octadecene, octadecylamine, dodecylamine, tetradecylamine, dodecanethiol, octanethiol and octadecanethiol, but is not limited thereto.

In some embodiments, the gold source comprises a combination of any one or more than two of sodium chloroaurate, chlorauric acid, gold nitrate, gold chloride, gold hydroxide, gold oxide, gold nanorods and gold particles, but is not limited thereto.

The silver salt, the negative ion source, the weakly polar solvent and the metal positive ion source and the like described above can be selected from types listed as above, but are not limited thereto.

Further, in a typical embodiment, the preparation method can comprise: dissolving silver nitrate into oleylamine, adding a selenium source, reacting for 1-6 h at 300° C., and then washing to obtain a target product silver selenide quantum dots precursor.

Further, a mass ratio of the silver salt to the selenium source is 0.1-1 g: 0.1-1 g.

In some preferred embodiments, the preparation method can comprise: dissolving 0.1-1 g of silver salt into a weakly polar solvent.

Further, the preparation method specifically comprises: mixing the silver selenide precursor with a gold source, and reacting at 100-200° C. to obtain near-infrared silver gold selenide fluorescent quantum dots.

Further, the preparation method also comprises: washing the obtained silver gold selenide fluorescent quantum dots after the reaction is ended.

Where, as one of more specific embodiments, the preparation method can comprise the following steps:
I. performing ultrasonic homodisperse after a silver salt is mixed with a weakly polar solvent;
II. adding a selenium source into the mixed solution finally obtained in step I, mixing, performing homodisperse, and then reacting for 0.5-24 h at 100-300° C.;
III. separating the product obtained by solvothermal reaction in step II, washing and drying; and
IV. reacting the product obtained in step III with a gold source for 10-72 h at 0-200° C. to obtain the near-infrared silver gold sulfur fluorescent quantum dots.

In the present disclosure, the silver selenide quantum dots are prepared through a simple high-temperature solvothermal method, and then the silver gold selenium quantum dots are obtained by a cation exchange method, so the synthesis process is simple in steps, controllable in experiment conditions, simple and available in used reagents, high in final product yield and suitable for large-scale production.

The final product near-infrared silver gold selenium fluorescent quantum dots prepared in the present disclosure has uniform size distribution, fluorescence emission peak wavelength of 800-1700 nm, preferably 800-1350 nm, and ultrahigh absolute quantum yield (more than 90%), and meanwhile does not contain any toxic heavy metal elements. Furthermore, the yield of the final product is relatively high, and the preparation process is easy to amplify the reaction scale.

Further, the preparation process of the present disclosure can also be expanded into preparation processes of other near-infrared silver gold selenide fluorescent quantum dots, has a high yield and is easy to amply the reaction scale.

As another aspect of the technical solution of the present disclosure, also provided are the near-infrared silver gold selenide fluorescent quantum dots prepared by the above method.

Further, the near-infrared silver gold selenide fluorescent quantum dots have a diameter of 2-20 nm.

Further, the near-infrared silver gold selenide fluorescent quantum dots have a fluorescence emission peak wavelength of 800-1700 nm, preferably 800-1350 nm, and absolute quantum yield of more than 90%, and meanwhile does not contain any toxic heavy metal elements.

As another aspect of the technical solution of the present disclosure, the present disclosure also provides near-infrared silver gold selenide fluorescent quantum dots, which have homogeneous morphology and size, and high absolute quantum yield, and do not contain any toxic heavy metal elements, and have important disclosure prospect in the fields of biological imaging, biological medicines or near-infrared devices.

Another aspect of the Embodiments of the present disclosure also provide use of the above any alloyed fluorescent quantum dots or near-infrared silver gold selenide fluorescent quantum dots in the fields of biological imaging, biomedicines or near-infrared devices.

Further, the near-infrared devices can be near-infrared light-emitting diodes, solar cells, photoelectric detectors or lasers, or the like, but is not limited thereto.

In summary, in the present disclosure, the silver-based quantum dots are prepared by using the simple high-temperature solvothermal method, and then the alloyed quantum dots are obtained by using the ion exchange method. The synthesis process is simple and controllable, high yield and can be used for large-scale preparation. Furthermore, the fluorescence emission of the alloyed quantum dots can is adjusted from visible light to near-infrared light region. Moreover, the alloyed quantum dots have excellent photostability and meanwhile do not contain any toxic heavy metal elements, and have wide disclosure prospect in the fields of biological imaging, near-infrared devices and the like.

In order to make the purpose, technical scheme and advantages of the disclosure clearer, the technical solution of the present disclosure is further described in detail below in combination with several preferred embodiments. However, the disclosure is not limited to the following embodiments. The non-essential improvements and adjustments made by those skilled in the art under the core guiding ideology of the disclosure still belong to the protection scope of the disclosure. Unless otherwise specified, various reagents used in the following embodiments are well known to those skilled in the art and can be obtained through market purchase and other means. The experimental methods without specific conditions in the following embodiments are usually in accordance with the conventional conditions or the conditions recommended by the manufacturer.

Example 1

0.06 g of silver nitrate was dissolved into 20 mL of oleylamine and subjected to ultrasonic homodisperse, subsequently 0.06 g of sulfur powder was added, the above materials reacted for 5 h at 200° C. to obtain a silver sulfide precursor, then 0.06 g of chloroauric acid was added, and the above materials reacted for 48 h at 100° C. to obtain silver gold sulfur fluorescent quantum dots.

It can be seen from FIG. 1 that the silver gold sulfur fluorescent quantum dots obtained in this example has a homogenous morphology size which is about 4.5 nm.

Figure 2:
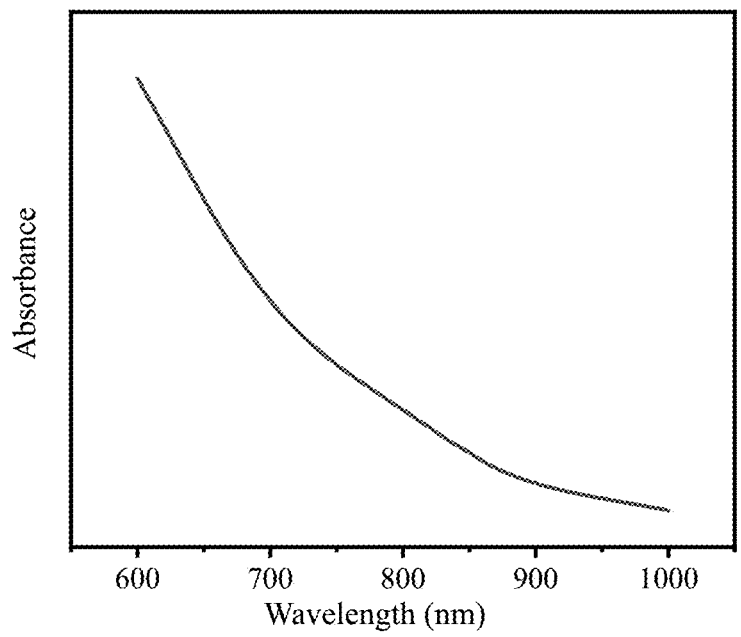
FIG. 2 is a visible-near infrared absorption spectrogram of alloyed fluorescent quantum dots prepared in example 1 of the present disclosure.
Figure 3:
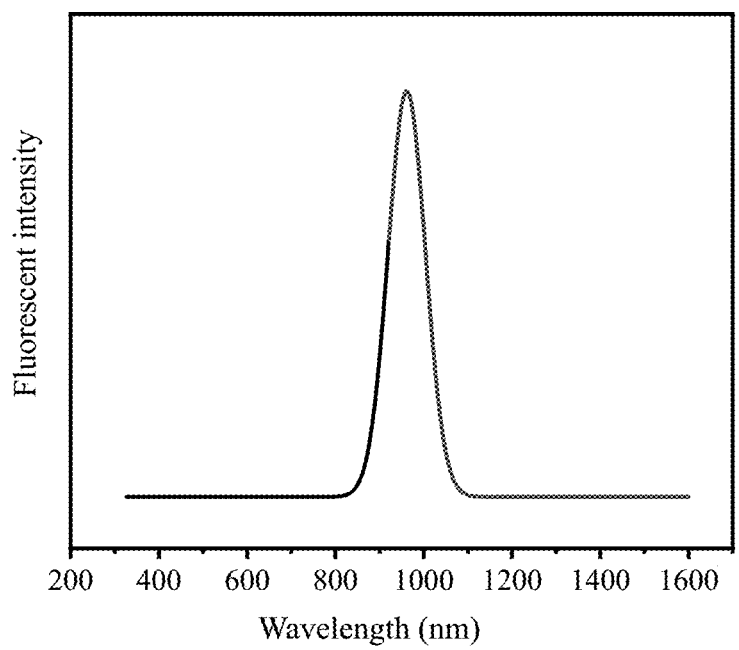
FIG. 3 is a fluorescence emission spectrum of alloyed fluorescent quantum dots prepared in example 1 of the present disclosure.
Figure 4:
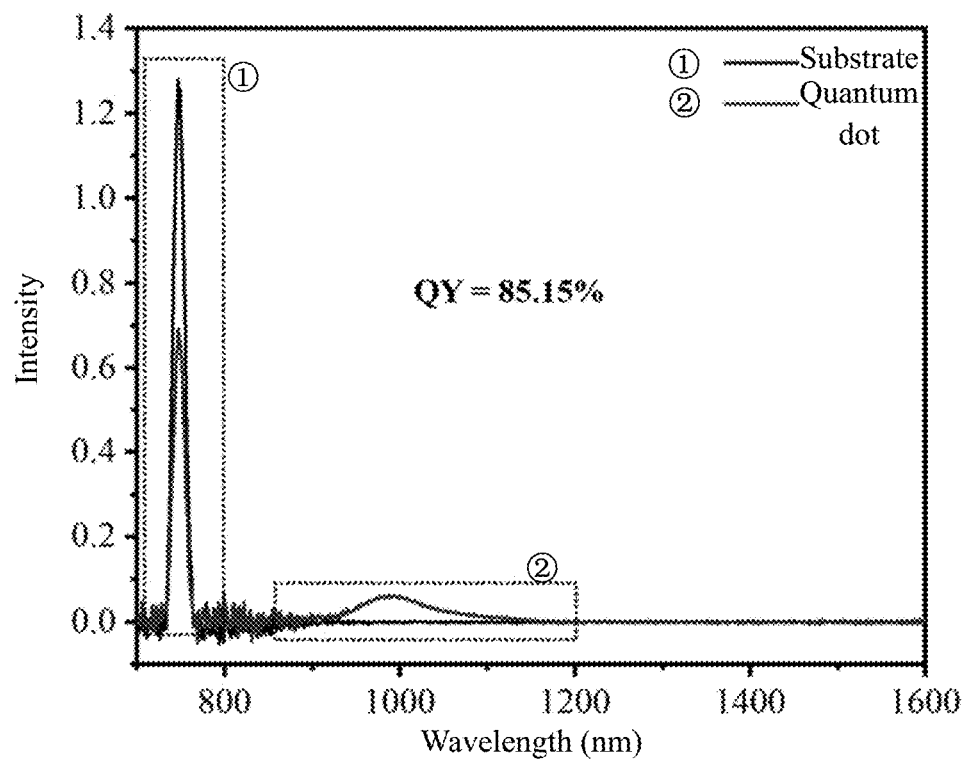
FIG. 4 is a quantum efficiency measurement spectrum of alloyed fluorescent quantum dots prepared in example 1 of the present disclosure.

The above silver gold sulfur quantum dots were dispersed into chloroform. The absorption spectrum of the above silver gold sulfur quantum dots was measured using a visible-near infrared absorption spectrometer. It can be seen that the quantum dots have strong absorption in a visible-infrared region, as shown in FIG. 2. The luminescence spectrum and the absolute fluorescent quantum yield of the above silver gold sulfur quantum dots were further measured using a near-infrared fluorescent spectrometer. It can be seen from FIG. 3 that the silver gold sulfur quantum dots are emitted at 800-1100 nm, and it can be seen from FIG. 4 that the absolute quantum efficiency of the silver gold sulfur quantum dots is 85.15%.

Example 2

0.06 g of silver acetate was dissolved into 20 mL of oleylamine and subjected to ultrasonic homodisperse, subsequently 0.06 g of sulfur powder was added, the above materials reacted for 0.5 h at 250° C. to obtain a silver sulfide precursor, then 0.6 g of cuprous chloride was added, and the above materials reacted for 10 h at 200° C. to obtain silver copper sulfur fluorescent quantum dots.

Example 3

0.6 g of silver nitrate was dissolved into 20 mL of octadecylthiol and subjected to ultrasonic homodisperse, subsequently 0.6 g of tellurium powder was added, the above materials reacted for 5 h at 150° C. to obtain a silver telluride precursor, then 0.6 g of selenium powder was added, and the above materials reacted for 24 h at 100° C. to obtain silver selenium tellurium fluorescent quantum dots.

Example 4

0.06 g of silver trifluoroacetate was dissolved into 20 mL of dodecylamine and subjected to ultrasonic homodisperse, subsequently 0.06 g of selenium powder was added, the above materials reacted for 10 h at 180° C. to obtain a silver selenide precursor, then 0.06 g of chloroplatinic acid was added, and the above materials reacted for 72 h at 0° C. to obtain silver platinum selenium fluorescent quantum dots.

Example 5

0.06 g of silver chloride was dissolved into 20 mL of octanethiol and subjected to ultrasonic homodisperse, subsequently 0.6 g of sulfur powder was added, the above materials reacted for 12 h at 200° C. to obtain a silver sulfide precursor, then 0.06 g of ferrous chloride was added, and the above materials reacted for 72 h at 0° C. to obtain silver iron selenium fluorescent quantum dots.

Example 6

0.6 g of silver sulfide was dissolved into 20 mL of cetylamine and subjected to ultrasonic homodisperse, subsequently 0.06 g of selenium powder was added, the above materials reacted for 5 h at 200° C. to obtain a silver selenide precursor, then 0.06 g of palladium chloride was added, and the above materials reacted for 72 h at 0° C. to obtain palladium silver selenium fluorescent quantum dots.

Example 7

0.06 g of silver iodide was dissolved into 20 mL of oleylamine and subjected to ultrasonic homodisperse, subsequently 0.06 g of selenium powder was added, the above materials reacted for 5 h at 200° C. to obtain a silver selenide precursor, then 0.06 g of manganese chloride was added, and the above materials reacted for 72 h at 0° C. to obtain manganese-doped silver selenide fluorescent quantum dots.

Example 8

0.06 g of silver acetate was dissolved into 20 mL of oleylamine and subjected to ultrasonic homodisperse, subsequently 0.06 g of selenium powder was added, the above materials reacted for 0.5 h at 300° C. to obtain a silver selenium precursor, then 0.06 g of sulfur powder was added, and the above materials reacted for 72 h at 100° C. to obtain $Ag_2Se@Ag_2S$ fluorescent quantum dots.

Example 9

0.6 g of silver sulfate was dissolved into 20 mL of octadecylthiol and subjected to ultrasonic homodisperse, subsequently 0.06 g of tellurium powder was added, the above materials reacted for 1 h at 150° C. to obtain a silver telluride precursor, then 0.6 g of sulfur powder and 0.06 g of zinc acetate were added, and the above materials reacted for 0.4 h at 260° C. to obtain $Ag_2Te@ZnS$ fluorescent quantum dots.

Example 10

0.5 g of silver diethyldithiocarbamate was dissolved into 20 mL of octadecylthiol and subjected to ultrasonic homodisperse, subsequently 0.06 g of tellurium powder was added, the above materials reacted for 1 h at 200° C. to obtain a silver telluride precursor, then 0.06 g of nickel acetate was added, and the above materials reacted for 2 h at 150° C. to obtain nickel-doped silver telluride fluorescent quantum dots.

Example 11

0.04 g of silver acetate was dissolved into 20 mL of dodecanethiol and subjected to ultrasonic homodisperse, subsequently 0.06 g of sulfur powder was added, the above materials reacted for 1 h at 200° C. to obtain a silver sulfide precursor, then 0.06 g of indium acetate was added, and the above materials reacted for 2 h at 150° C. to obtain indium-doped silver sulfide fluorescent quantum dots.

Example 12

0.06 g of silver carbonate was dissolved into 20 mL of dodecanethiol and subjected to ultrasonic homodisperse, subsequently 0.06 g of sulfur powder was added, the above materials reacted for 24 h at 100° C. to obtain a silver sulfide precursor, then 0.06 g of cobalt chloride was added, and the above materials reacted for 48 h at 100° C. to obtain cobalt-doped silver sulfide fluorescent quantum dots.

In addition, the inventors of this case also utilize other raw materials listed as above and other process conditions to replace various raw materials and corresponding process conditions in examples 1-12 to perform corresponding tests, the morphologies, performances and others of the obtained alloyed fluorescent quantum dots are ideal and basically similar to those of products in examples 1-12.

Example 13

0.06 g of silver nitrate was dissolved into 20 mL of oleylamine and subjected to ultrasonic homodisperse, subsequently 0.06 g of selenium powder was added, the above materials reacted for 5 h at 200° C. to obtain a silver selenide quantum dots precursor (0.6 g), then 0.06 g of chloroauric acid was added, and the above materials reacted for 48 h at 100° C. to obtain near-infrared silver gold selenide fluorescent quantum dots.

Figure 5A:
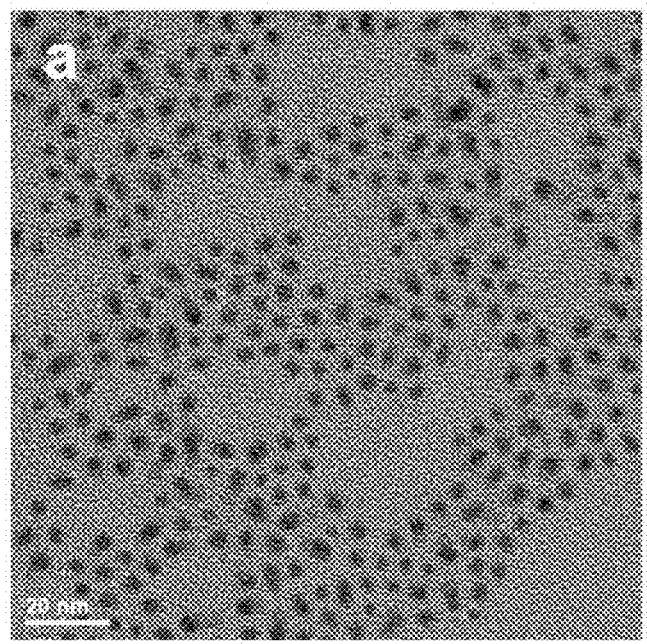
FIG. 5A is a transmission electron microscopy image of near-infrared silver gold selenide fluorescent quantum dots in example 13 of the present disclosure.
Figure 5B:
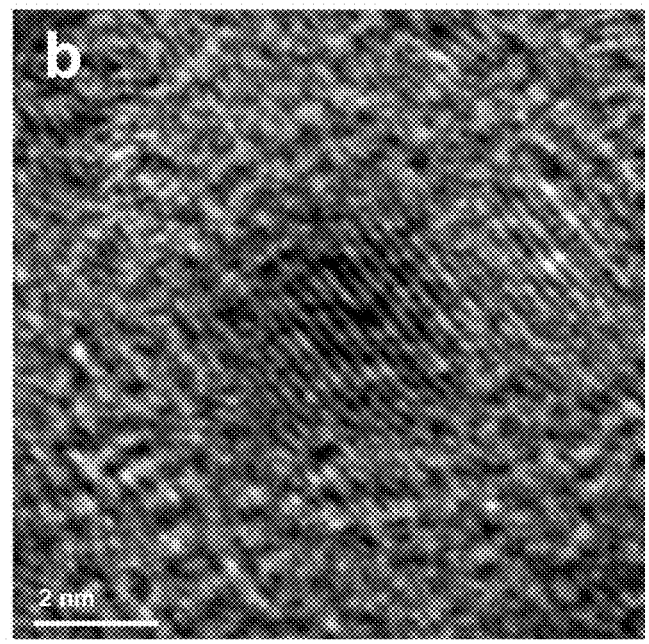
FIG. 5B is a high-resolution transmission electron microscopy image of near-infrared silver gold selenide fluorescent quantum dots in example 13 of the present disclosure.
Figure 6:
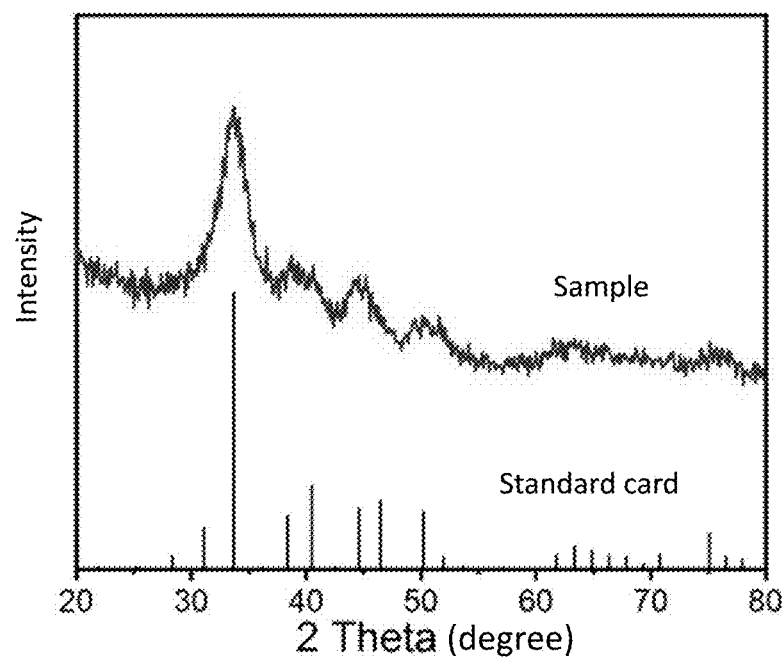
FIG. 6 is a powder X-ray diffraction pattern of near-infrared silver gold selenide fluorescent quantum dots in example 13 of the present disclosure.
Figure 7:
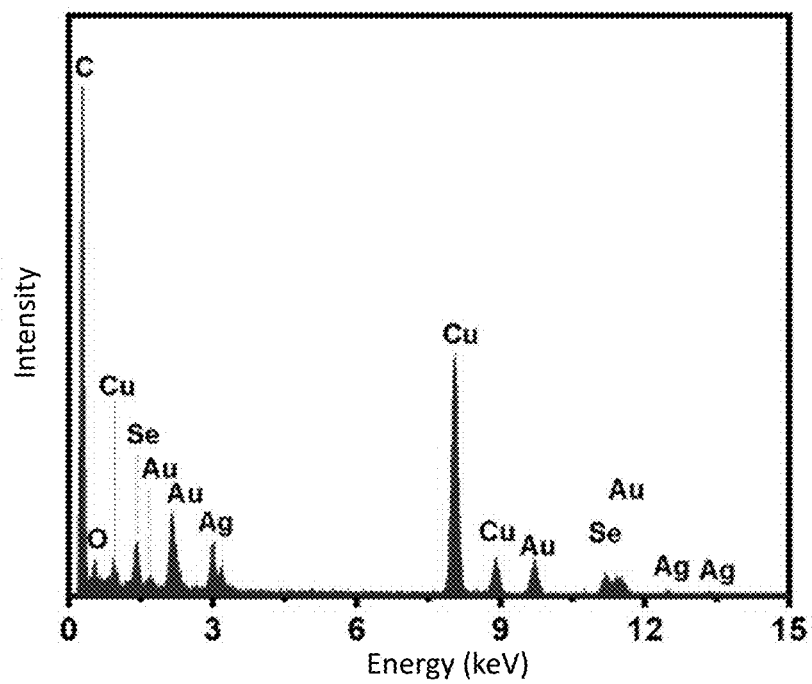
FIG. 7 is an energy dispersion X-ray spectrum of near-infrared silver gold selenide fluorescent quantum dots in example 13 of the present disclosure.

It can be seen from FIGS. 5A-5B that the near-infrared silver gold selenide fluorescent quantum dots obtained in this example has a homogenous product morphology size which is about 4.8 nm, wherein FIG. 5A is a transmission electron microscopy image of near-infrared silver gold selenide fluorescent quantum dots, FIG. 5B is a high-resolution transmission electron microscopy image of near-infrared silver gold selenide fluorescent quantum dots. Please refer to FIG. 6 and FIG. 7. It can be seen through powder X-ray diffraction and energy dispersion X ray spectrums that this nanoparticle material is a silver gold selenium compound.

Figure 8A:
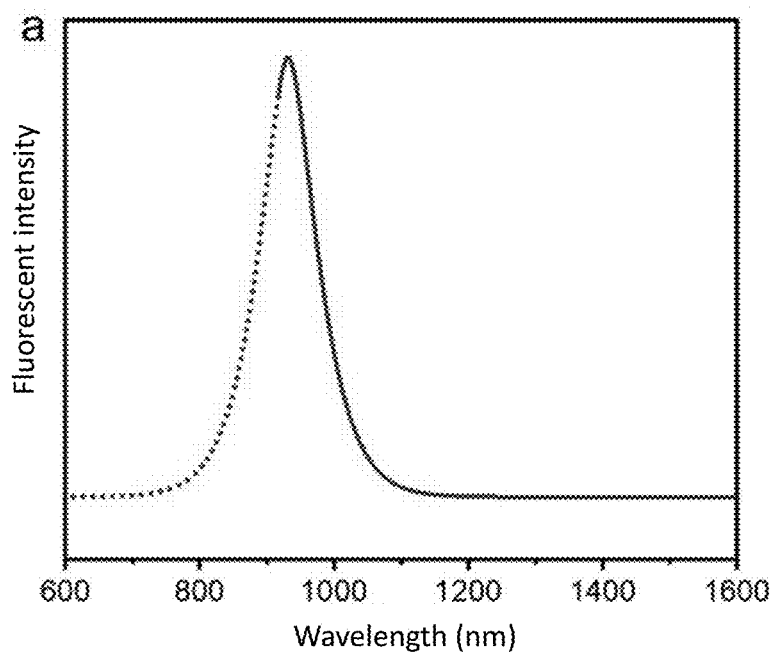
FIG. 8A is a fluorescence emission spectrum of near-infrared silver gold selenide fluorescent quantum dots in example 13 of the present disclosure.
Figure 8B:
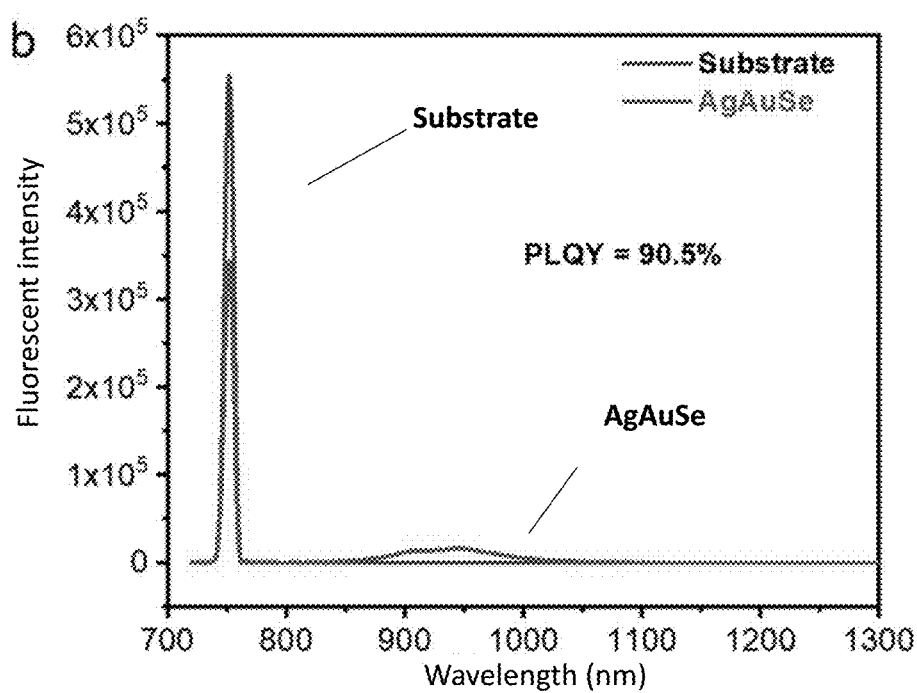
FIG. 8B is a quantum efficiency measurement spectrum of near-infrared silver gold selenide fluorescent quantum dots in example 13 of the present disclosure.

The above silver gold selenium quantum dots were dispersed into chloroform. The luminescence spectrum and the absolute fluorescent quantum yield of the silver gold selenium quantum dots were measured using a near-infrared fluorescent spectrometer. It can be seen from FIGS. 8A-8B that the silver gold selenium quantum dots are emitted at 800-1200 nm, and has an absolute quantum efficiency of 90.3%.

Example 14

0.06 g of silver carbonate was dissolved into 20 mL of octanethiol and subjected to ultrasonic homodisperse, subsequently 0.8 g of selenium dioxide was added, the above materials reacted for 2 h at 250° C. to obtain a silver selenide quantum dots precursor (0.05 g), then 0.5 g of gold nitrate was added, and the above materials reacted for 10 h at 200° C. to obtain near-infrared silver gold selenide fluorescent quantum dots.

Example 15

0.6 g of silver bromide was dissolved into 20 mL of oleylamine and subjected to ultrasonic homodisperse, subsequently 0.6 g of sodium selenate was added, the above materials reacted for 1 h at 200° C. to obtain a silver selenide quantum dots precursor (0.1 g), then 0.1 g of sodium chloroaurate was added, and the above materials reacted for 48 h at 100° C. to obtain near-infrared silver gold selenide fluorescent quantum dots.

Example 16

0.06 g of silver chloride was dissolved into 20 mL of dodecanethiol and subjected to ultrasonic homodisperse, subsequently 0.06 g of sodium selenide was added, the above materials reacted for 5 h at 100° C. to obtain a silver selenide quantum dots precursor (0.06 g), then 0.06 g of gold chloride was added, and the above materials reacted for 72 h at 0° C. to obtain near-infrared silver gold selenide fluorescent quantum dots.

Example 17

0.06 g of silver iodide was dissolved into 20 mL of octadecylamine and subjected to ultrasonic homodisperse, subsequently 0.06 g of diphenyl diselenide was added, the above materials reacted for 24 h at 200° C. to obtain a silver selenide quantum dots precursor (0.03 g), then 0.05 g of gold hydroxide was added, and the above materials reacted for 72 h at 0° C. to obtain silver gold selenide fluorescent quantum dots.

Example 18

0.06 g of silver diethyldithiocarbamate was dissolved into 20 mL of octadecylthiol and subjected to ultrasonic homodisperse, subsequently 0.06 g of selenium powder was added, the above materials reacted for 0.5 h at 300° C. to obtain a silver selenide quantum dots precursor (0.06 g), then 0.06 g of gold oxide was added, and the above materials reacted for 72 h at 0° C. to obtain near-infrared silver gold selenide fluorescent quantum dots.

Example 19

0.06 g of silver trifluoroacetate was dissolved into 20 mL of octadecene and subjected to ultrasonic homodisperse, subsequently 0.06 g of selenium powder was added, the above materials reacted for 24 h at 200° C. to obtain a silver selenide quantum dots precursor (0.06 g), then 0.06 g of gold nanorods was added, and the above materials reacted for 72 h at 0° C. to obtain near-infrared silver gold selenide fluorescent quantum dots.

In addition, the inventors of this case also utilize other raw materials listed as above and other process conditions to replace various raw materials and corresponding process conditions in examples 13-19 to perform corresponding tests, the morphologies, performances and others of the obtained near-infrared silver gold selenide fluorescent quantum dots are ideal and basically similar to those of products in examples 13-19.

In summary, in the present disclosure, the silver-based quantum dots are prepared by using the simple high-temperature solvothermal method, and then the alloyed quantum dots are obtained by using the ion exchange method. The synthesis process is simple and controllable, high yield and can be used for large-scale preparation. Furthermore, the fluorescence emission of the alloyed quantum dot can perform fluorescence emission is adjusted in a visible light-near-infrared light region. Moreover, the alloyed quantum dot has excellent photostability and meanwhile does not contain any toxic heavy metal elements, and has wide disclosure prospect in the fields of biological imaging, near-infrared devices and the like.

The technical solution of the present disclosure is illustrated in detail with the above examples. It should be understood that the above descriptions are specific embodiments of the present disclosure, but not used for limiting the present disclosure. Any amendments, supplements or similar replacements made within the principle scope of the present disclosure should be included within the protective scope of the present disclosure.

Although the present disclosure has been described by reference with illustrative embodiments, it will be understood by those skilled in the art that various other variations, abbreviations and/or additions and available substantive equivalents made without departing from the spirit and scope of the present disclosure replace the elements of the examples. In addition, many amendments are made without departing from the scope of the present disclosure so that specific situations or materials are adapted to the teaching of the present disclosure. Thus, it is not intended herein to limit the present disclosure to perform the specific examples disclosed in the present disclosure, but it is intended that the present disclosure includes all embodiments that fall within the scope of the appended claims.

What is claimed is:

1. A preparation method of near-infrared silver gold selenide fluorescent quantum dots, comprising:
   1) carrying out solvothermal reaction on a first evenly mixed reaction system comprising a silver source, a selenium source, and a weakly polar solvent to prepare a silver selenide quantum dots precursor; and
   2) carrying out ion exchange reaction on a second evenly mixed reaction system comprising the silver selenide quantum dots precursor and a gold source for 10-72 h at 0-200° C. to obtain the near-infrared silver gold selenide fluorescent quantum dots.

2. The preparation method according to claim 1, wherein step 1 comprises: evenly mixing the silver source with the weakly polar solvent and then adding the selenium source to form the first evenly mixed reaction system, and carrying out the solvothermal reaction on the first evenly mixed reaction system for 0.5-24 h, at 100-300° C. to prepare the silver selenide quantum dots precursor; and/or
a mass ratio of the silver source to the selenium source is 1-10:1-10.

3. The preparation method according to claim 1, wherein step 2 comprises evenly mixing the silver selenide quantum dots precursor and the gold source as well as the weakly polar solvent to form the second evenly mixed reaction system; and/or
a mass ratio of the silver selenide quantum dots precursor to the gold source is 1-10:1-10.

4. The preparation method according to claim 1, wherein the silver salt comprises at least one selected from the group consisting of silver chloride, silver bromide, silver iodide, silver sulfate, silver nitrate, silver carbonate, silver sulfide, silver trifluoroacetate, and silver diethyldithiocarbamate; and/or
the selenium source comprises at least one selected from the group consisting of selenium dioxide, selenium powder, sodium selenate, sodium selenite, sodium selenide, and diphenyl diselenide; and/or
the weakly polar solvent comprises at least one selected from the group consisting of oleylamine, oleic acid, octadecene, octadecylamine, dodecylamine, tetradecylamine, dodecanethiol, octanethiol, and octadecanethiol; and/or
the gold source comprises at least one selected from the group consisting of sodium chloroaurate, chloroauric acid, gold nitrate, gold chloride, gold hydroxide, gold oxide, gold nanorods, and gold particles.

5. Near-infrared silver gold selenide fluorescent quantum dots, wherein the near-infrared silver gold selenide fluorescent quantum dots are prepared by the method according to claim 1, wherein the near-infrared silver gold selenide fluorescent quantum dots have a diameter of 2-20 nm with uniform size distribution, a fluorescence emission peak wavelength of 800-1700 nm, and an absolute quantum yield of more than 90%.

* * * * *